United States Patent [19]
Gordon et al.

[11] Patent Number: 5,542,457
[45] Date of Patent: Aug. 6, 1996

[54] FINE PITCH ELECTRONIC COMPONENT LEAD STRAIGHTENING METHOD AND APPRATUS

[76] Inventors: Thomas Gordon, 12044 Rue Des Amis, San Diego, Calif. 92131; Douglas Farlow, 11873 Calle Parral, San Diego, Calif. 92128

[21] Appl. No.: 370,632

[22] Filed: Jan. 10, 1995

[51] Int. Cl.$^6$ ............................................ B21F 1/02
[52] U.S. Cl. ................................. 140/147; 140/123
[58] Field of Search ........................... 140/105, 147, 140/106, 123; 29/758, 759

[56] References Cited

U.S. PATENT DOCUMENTS 3,553,819  1/1971  Johnson et al. ................... 29/758

*Primary Examiner*—Lowell A. Larson
*Attorney, Agent, or Firm*—John R. Duncan; Frank D. Gilliam

[57] ABSTRACT

A kit tools for use in repairing bent leads on fine pitch surface mount electronic components and a method of repairing such bent leads. The kit basically comprises a plate having a precisely flat surface and a template having a plurality of recesses corresponding to the lead pattern on a component to be repaired. The template is secured to the plate surface, such as by tape extending across tabs extending from the template. A means such as a vacuum pen is used to lift and move the component without touching the leads. A variety of probes, tweezers and the like are used to bend leads back to proper positions. The component may be placed directly against the surface when checking and correcting lack of lead coplanarity and linearity. Grossly bent leads may be corrected with the component on the surface, while precise positioning is accomplished with the component in the template, since fine adjustments can be made and the minor non-alignment can be easily observed and corrected.

7 Claims, 2 Drawing Sheets

5,542,457

FINE PITCH ELECTRONIC COMPONENT LEAD STRAIGHTENING METHOD AND APPRATUS

BACKGROUND OF THE INVENTION

This invention relates in general to straightening of electronic component leads and, more specifically, to a method and apparatus for very precisely straightening and aligning high lead count, fine pitch, component leads on an electronic component.

Originally, printed circuit boards included plated holes into which leads of electronic components were inserted and soldered. Currently, circuit boards tend to have closely spaced surface pads with the component simply placed on the board with leads in contact with the pads, to which the leads are then soldered.

The pattern of closely spaced pads for connection to component leads are usually formed on the printed circuit board base by chemical etching techniques. After board fabrication and during assembly operations a stencil having through holes conforming to the pad pattern is placed over the pad array and precisely aligned therewith. A solder paste made up of very small solder balls in a slurry of flux and other ingredients is wiped over the stencil with a squeegee, forcing small amounts of paste through the holes onto the pads. The stencil is lifted away leaving the paste on the pads. The components must then be very precisely placed on the board with the component leads aligned with the pads. Typical so called "gull wing" type leads typically may have up to 376 leads with a lead-to-lead pitch of 0.4 mm. Once the component is placed, the solder is melted, generally in an infrared or convection oven, and bonds between the pad and lead.

With the very close spacing required over a very large number of leads, bent or twisted leads or leads that have ends out of the normal lead end plane cannot be mounted by this method. During production mounting, out of tolerance components are rejected. Many of the high rate component placement devices include vision equipment that senses out of tolerance conditions and reject those components. With inexpensive components, those rejected are usually scrapped. With the recent expensive very high density components repair of the leads is highly desirable.

Expensive, complex machines have been developed to bring component leads back into alignment. These machines are too expensive for small manufacturers. Further, they are not easily convertible to handle different components, so are not efficient for short run production.

Technicians will often try to use probes to attempt to bend leads back into alignment. This requires considerable skill and often results in lead damage or breakage. While one lead is being straightened, adjacent leads may be inadvertently contacted and damaged. In particular, it is difficult to align the ends of a large number of leads into a common plane and to correct twisted lead ends. Imperfect corrections will lead to problems when the component is mounted and soldered to a board.

Thus, there is a continuing need for methods and devices for realigning electronic component leads that is low in cost, does not require highly skilled technicians and can rapidly and effectively return the lead array to an "in tolerance" condition.

SUMMARY OF THE INVENTION

The above-noted problems, and others, are overcome by the method and apparatus of this invention which basically comprises a tool kit and a method of using the kit which comprises a template having recesses precisely corresponding the lead end shapes and spacing, a means such as a vacuum pen for lifting components onto and off of the template, at least one lead straightening tool such as probes and tweezers, and a precisely flat surface, such as a granite surface plate. The kit preferably is used in a well lighted area and vision magnifying means is very helpful.

In using this kit, a technician initially selects a template corresponding to the component to be repaired and secures the corners to the flat plate, typically using lithographer's tape. A component is carefully place over the template and the leads are inspected to determine the precise problem.

Conventional leads extend out of the component and have distal ends bent into a single plane for soldering to the planar array of solder pads on a printed circuit board. Generally, each lead extends perpendicular to a side of the component, is curved in a "gull wing" or "squared S" shape to the coplanar ends.

A variety of different types of damage can occur and can be corrected using this kit, as detailed below. Basically, the lead may be bent or twisted overall in any direction, the shape of the "S" may be distorted, the lead ends may not be properly coplanar, etc.

Grossly bent or distorted leads are moved back to approximately the correct position while the component is held, as by a vacuum pen or is lying on its back on the flat plate surface. Then the component is placed in the template and non-conforming leads are bent, twisted, or simply pushed into the proper template recess as necessary. The component may be placed directly on the surface plate to check overall coplanarity. Once repair is complete, the component should easily slip in and out of the template recesses with no binding or catching on recess edges.

BRIEF DESCRIPTION OF THE DRAWING

Details of the invention, and of preferred embodiments thereof, will be further understood upon reference to the drawing, wherein.

DETAILED DESCRIPTION OF PREFERRED EMBODIMENTS

Figure 1:
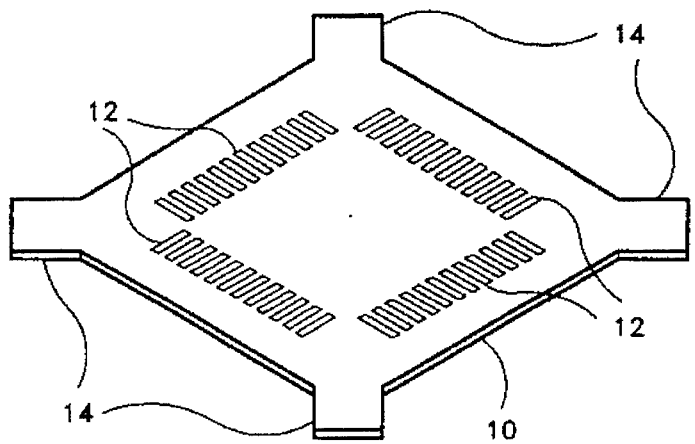
FIG. 1 is a perspective view of a template as used in the kit and method of this invention.

Referring to FIG. 1, there is seen a template 10 having a pattern of recesses 12 very precisely conforming to the ideal configuration of lead feet of a particular fine pitch, surface-mount, electronic component of the sort shown in FIGS. 2–8. Typically the components are of the type generally referred to as "Quad Flat Pack" components having "gull wing" leads. These components typically have up to 376 leads and a 0.4 mm pitch.

Template 10 may have width and height corresponding to the particular component to be repaired. Generally, a repair kit will include a number of different components of the type used by the repairing organization. While any suitable template thickness and recess depth (up to entirely through the template) may be used, preferably template 10 has a thickness of from about 0.004 to 0.012 inch and recess depths of from about ¼ to ½ the thickness of the leads on the component to be repaired. Lead feet may be difficult to hold in shallower recesses, while deeper recesses may catch the edges of lead feet when the component is placed in, then removed from, the recess pattern. Generally lead feet have small burrs along their edges, resulting from the lead stamping operation. These burrs are toward the top edges of the lead feet, so that we have found that these burrs can be prevented from catching on the recess sides, and bending the leads, if the recess depths are less than the height of these burrs.

Figure 2:
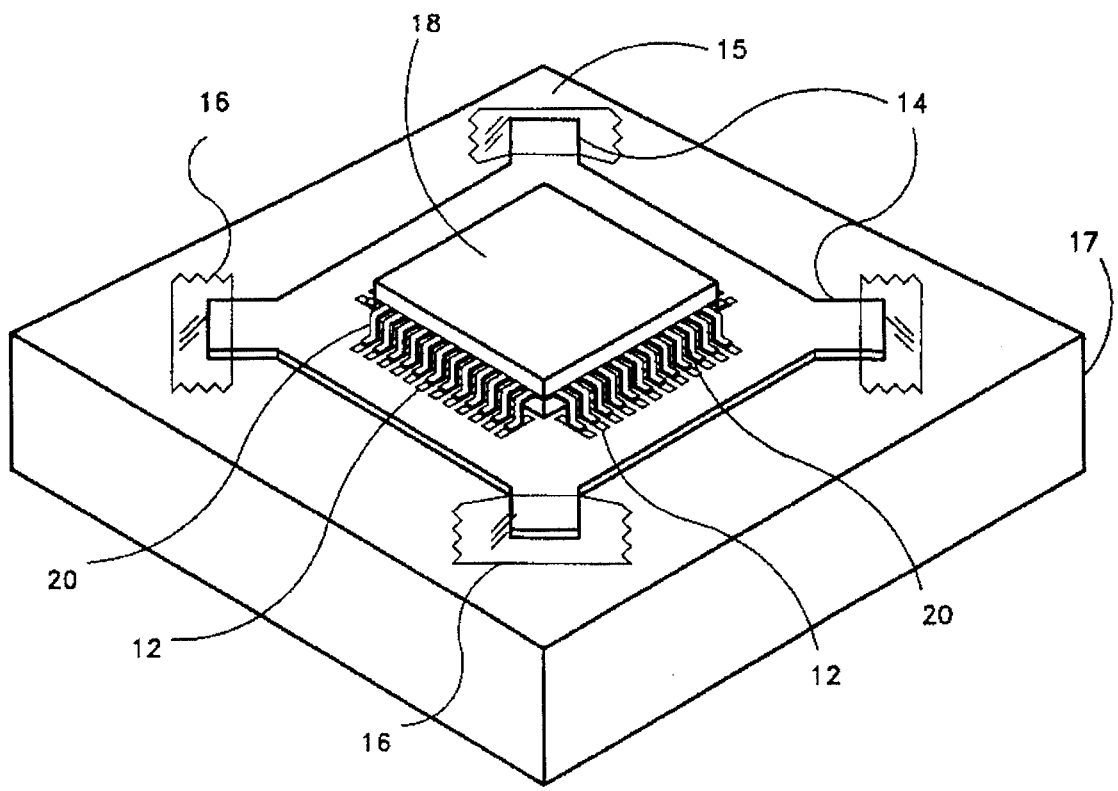
FIG. 2 is a perspective view of the template mounted on a surface plate.

Corner tabs 14 are provided to allow template 10 to be secured to a surface 15 by tape strips 16 extending across the tabs, as seen in FIG. 2. While any suitable number of tabs 14 may be used, at least two, for best results four corner tabs as shown are preferred to assure proper positioning of the template. Any suitable tape may be used, either transparent as shown or opaque. Conventional lithographer's tape is preferred since it holds securely and can be easily removed without leaving a residue.

Surface 15 should be uniformly very flat. Any suitable material having a uniform very flat surface 15 may be used. Preferably, surface 15 is a precisely ground and polished surface of a granite surface plate 17, because of the highly uniform thermal expansion characteristics of such materials, so that the surface remains flat despite temperature changes.

An undamaged component 18 having a pattern of leads 20 corresponding to the selected template 10, will fit the template with the feet of all leads 12 exactly filling and substantially filling all recesses 12. When a component 18 with damaged leads 20 is placed on template 10, the damaged leads will not fit into the corresponding recesses, so that the location of the damaged leads will be readily apparent.

FIGS. 3–8 illustrate repair of a number of different types of damage that may occur to component leads.

Figure 3:
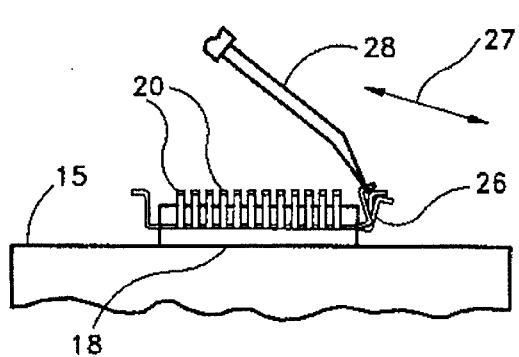
FIG. 3 is a schematic elevation view illustrating repair of leads bent toward or away from an electronic component.

As seen in FIG. 3, where leads 20 are grossly bent, component 18 is initially laid on its back on surface 15 and the damaged leads are carefully bent with suitable probes 22, tweezers or other tools back to near the proper position. In the case shown in FIG. 3, a pointed probe 22 or tweezers can move bent leads 26 in the general directions indicated by arrow 27 to return them to the general proper position. Any suitable probes, having sharply pointed ends, blunt ends of different diameters, having straight or bent handles and tweezers of different lengths, widths and shapes may be used, as desired. Conventional component leads are relatively soft, with little spring-back, so once a lead is moved to a proper position, it will tend to remain in that position. A repair technician will soon learn to accommodate any slight spring-back that may be present with some component leads.

Figure 4:
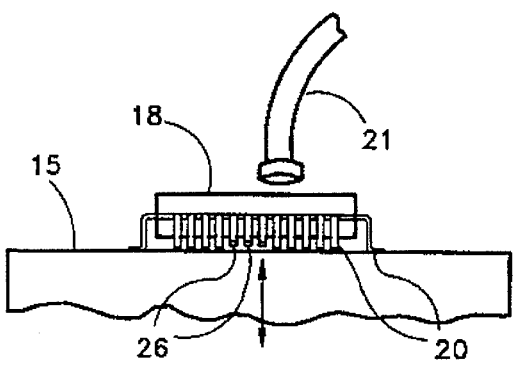
FIG. 4 is a schematic elevation view illustrating checking of coplanarity of leads.

Coplanarity can be checked, as seen in FIG. 4, by placing component 18 with leads 20 in contact with surface 15. Component 18 is lifted and placed on surface 15 and template 10 using a device that avoids contact by fingers, etc., with leads 20. Preferably a conventional vacuum pen having a tube with a soft end seal and within which a slight vacuum can be maintained, is used for moving component 18.

Once component 18 is placed on a surface 15, it can be held in place by one of the technician's fingers while leads are repositioned. The leads in aggregate have sufficient strength to avoid distortion even with fairly strong finger pressure. 0f course, individual leads are readily bent.

Any leads bent up or down so that all lead feet do not lie in the same plane will become readily apparent when component 18 rests on surface 15. Bent leads 26 in this case can be bent back to the proper plane with a probe, or if not far from the correct plane can be bent with the component in template 10, as described below. Often leads 20 bent away from component 18 can be returned to the proper plane by gently pressing the component toward surface to bend all leads slightly toward the component. Coplanarity is generally of greater importance than some other minor lead location defects.

Figure 5:
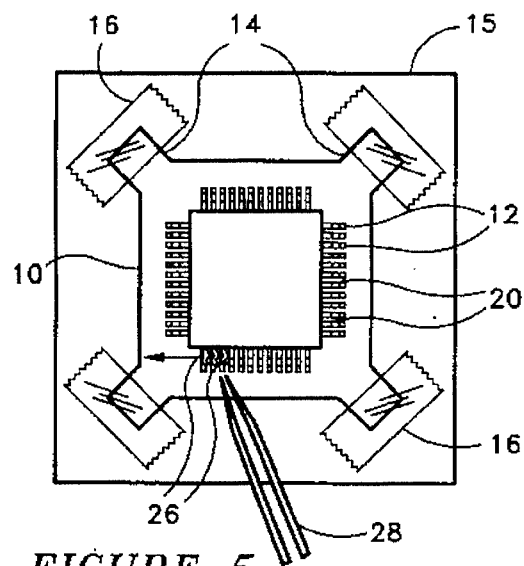
FIG. 5 is a schematic plan view illustrating repair of leads having knees bent to the side.

When grossly bent leads 20 have been brought back to approximately the correct position, component 18 is placed in template 10 having tabs 14 secured to surface 15 by tape 16 as seen in FIG. 5. Most leads 20 are in the proper positions and fit precisely in corresponding recesses 12. Bent leads 26, however are pushed over to the side, as seen. Tweezers 28, and/or probes may be used to push bent leads 26 to the side, as indicated by arrow 30, until they fit into corresponding recesses 12, as is readily observed by the repair technician.

Figure 6:
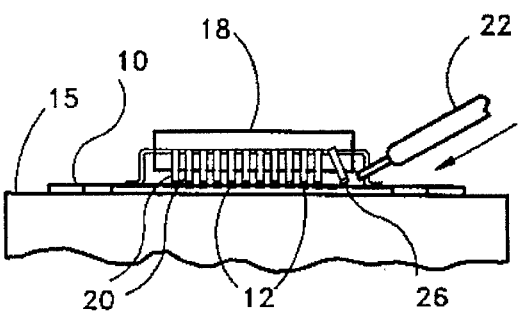
FIG. 6 is a schematic elevation view illustrating repair of leads bent off center.
Figure 7:
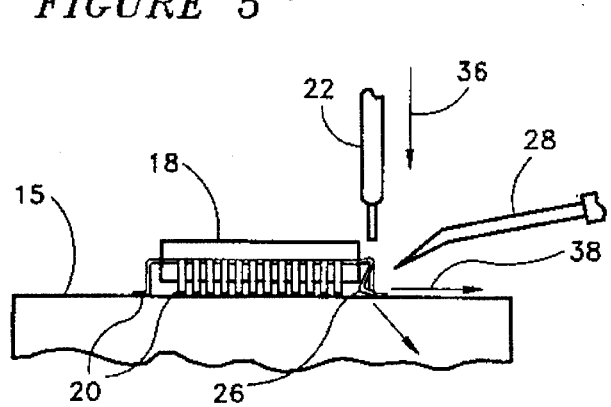
FIG. 7 is a schematic elevation view illustrating repair of kinked leads.

FIG. 6 illustrates the case where most leads 12 fit into corresponding recesses 12, but one bent lead 26 is bent off-center. With component 18 on template 10, with most leads 12 in recesses 20, bent lead 26 can be easily pushed back to the proper position by probe 22. The technician can easily see when bent lead 26 has been moved to the required extent.

Repair of a more complex defect is illustrated in FIG. 3. In this case component 18 has many leads in the proper configuration, with a few kinked leads 26. If the kinking is severe, component 18 may be placed directly on surface 15 for initial straightening. Then, component 18 may be place in a template 10 (as seen in FIGS. 2, 5 and 6) for final precise positioning. The knee portion 32 of lead 26 may be pressed down, as indicated by arrow 34, with probe 22 and the central or toe portion pulled in the direction of arrow 36 by tweezers 28 to return the lead to the proper configuration.

The ends of toes of leads 20 should be in a straight line. Linearity may be checked by placing component 18 generally perpendicular to surface, so that out-of-line bent leads 26 can be readily observed and identified. Outwardly bent leads 26 can be brought into line by gently pressing component downwardly in the direction of arrow 38. The inwardly bent lead 26 needs to be moved outwardly, which is most conveniently accomplished by placing component 18 in template 10 and moving the lead with tweezers 28 to the proper position.

Figure 8:
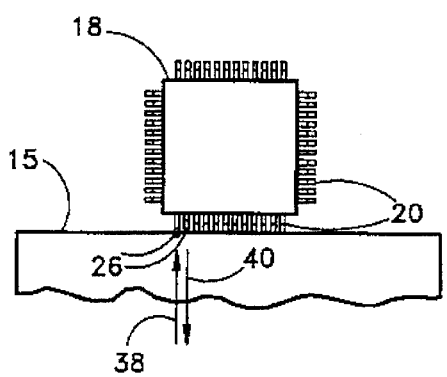
FIG. 8 is a schematic elevation view illustrating a toe position check and alignment of an outwardly bent toe.

When all leads have been repaired, with gross repairs done outside template 10 and fine repairs with component 18 in the template, coplanarity may be again checked as shown in FIG. 4 and linearity checked as shown in FIG. 8. "Fine tuning" of the lead positions may then be accomplished with component 18 in template 20. Skill in making these repairs is rapidly developed, with the repair technician soon learning which of a number of straight and bent probes, with bent or blunt ends and tweezers of varied configuration will be most effective with different bent leads.

While certain specific relationships, materials and other parameters have been detailed in the above description of preferred embodiments, those can be varied, where suitable, with similar results. Other applications, variations and ramifications of the present invention will occur to those skilled in the art upon reading the present disclosure. Those are intended to be included within the scope of this invention as defined in the appended claims.

I claim:

1. A kit for use in correcting the position of out-of-position leads of fine pitch surface-mount electronic components, which comprises:

a template having a linear pattern of individual closed recesses precisely matching the proper position of individual leads of the sort having a distal end lying generally parallel to said component on a predetermined fine pitch surface mount electronic component;

a surface plate having a flat surface for observing coplanarity of said leads and for supporting said template;

means for lifting and moving said component without contacting said leads; and at least one means for adjusting the position of out-of-tolerance leads.

2. The kit according to claim 1 further including at least two coplanar tabs integral with said template and extending away from said template and tape for fastening said tabs to said plate.

3. The kit according to claim 2 wherein said template is generally rectangular and said tabs extend from each template corner.

4. The kit according to claim 1 further including a vacuum pen for lifting and placing said components.

5. The kit according to claim 1 further including lighting means for illuminating said template.

6. The kit according to claim 1 further including a plurality of pointed probes and tweezers.

7. A method of correcting the position of out-of-position leads of fine pitch surface-mount electronic components, which comprises:

providing a template having a linear pattern of individual closed recesses precisely matching the proper position of leads of the sort having a distal end lying generally parallel to said component on a predetermined fine pitch surface mount electronic component;

fastening said template to a flat surface;

holding a component having at least one out-of-position lead;

observing any grossly out-of-position leads;

bending said grossly out-of-position leads to approximately the correct position;

placing said leads of said component into corresponding recesses in said template;

bending any out-of-position leads into the corresponding recesses;

placing said component on said flat surface with said leads in contact with said flat surface and observing coplanarity of lead ends;

bending any leads that are not coplanar back into that plane;

placing said component leads into said recesses;

if leads do not slip easily into and out of said recesses repeating said observing and bending steps as necessary.

* * * * *